United States Patent
Mauerman

[19]

[11] Patent Number: 6,157,198
[45] Date of Patent: Dec. 5, 2000

[54] AUTOMATIC TIMEBASE CALIBRATION FOR SYNCHRONIZING A TIMEBASE FREQUENCY WITH A FREQUENCY REFERENCE STANDARD

[75] Inventor: Jeff Mauerman, Tres Pinos, Calif.

[73] Assignee: Anritsu Company, Morgan Hill, Calif.

[21] Appl. No.: 09/095,516

[22] Filed: Jun. 10, 1998

[51] Int. Cl.[7] ............................. G01R 35/00; H03L 7/06
[52] U.S. Cl. .................. 324/601; 324/76.53; 324/76.71; 324/76.79; 331/14; 331/18
[58] Field of Search ................... 324/601, 76.52, 324/76.53, 76.71, 76.77, 76.79; 331/14, 17, 18

[56] References Cited

U.S. PATENT DOCUMENTS

| | | | |
|---|---|---|---|
| 4,580,107 | 4/1986 | Caldwell et al. | 331/14 |
| 5,048,335 | 9/1991 | Marsh et al. | 324/601 X |
| 5,079,522 | 1/1992 | Owen et al. | 331/17 |
| 5,382,922 | 1/1995 | Gersbach et al. | 331/14 |
| 5,450,458 | 9/1995 | Price et al. | 375/356 |
| 5,689,808 | 11/1997 | Sandahl et al. | 455/51.2 |

*Primary Examiner*—Glenn W. Brown
*Attorney, Agent, or Firm*—Fliesler Dubb Meyer & Lovejoy LLP

[57] ABSTRACT

The present invention is a timebase calibration system having a phase locked loop configuration. The system includes a phase detector having a first input receiving an output of an oscillator, and a second input which can be coupled to a frequency reference. The output of the phase detector is provided through a switch to a first input of a summer, while a second input of the summer is connected to a digital to analog (D/A) converter. The output of the summer is provided to a voltage control input of the timebase oscillator. The system further includes a digital voltmeter with an input connected to the output of the phase detector. With such a system, the output of the digital voltmeter provides a voltage proportional to the frequency error between the timebase oscillator and the frequency reference standard. By adjusting the digital input to the D/A converter to generate an analog output voltage which drives the output of the voltmeter to zero volts, the frequency of the timebase oscillator is calibrated to match the frequency reference.

10 Claims, 2 Drawing Sheets

AUTOMATIC TIMEBASE CALIBRATION FOR SYNCHRONIZING A TIMEBASE FREQUENCY WITH A FREQUENCY REFERENCE STANDARD

BACKGROUND OF THE INVENTION

1. Field of the Invention

The present invention relates to calibration of a timebase, or more particularly to adjusting a voltage control input of a timebase so that the timebase frequency is synchronized with a frequency reference standard.

2. Description of the Related Art

Existing techniques for timebase calibration require the use of measurement equipment provided external to an instrument containing the timebase, and require calibration measurements to be made by a trained technician. For example, calibration typically requires a frequency reference and the output of a timebase to each be connected to the input of a frequency counter. With the timebase being a voltage controlled oscillator (VCO), to perform calibration an operator adjusts the voltage control input to the timebase and monitors readings of the frequency counters to determine when the output frequency of the timebase is synchronized with the output frequency of the voltage reference. Such use of external measurement equipment and trained operators for timebase calibration is costly and time consuming.

SUMMARY OF THE INVENTION

The present invention allows an operator with no special training to calibrate a timebase of an instrument. The present invention can further enable automatic timebase calibration upon connection of a frequency reference standard.

Using the present invention, calibration of a timebase can further be performed without measuring equipment being provided external to an instrument containing the timebase.

The present invention is a timebase calibration system having a phase locked loop configuration including: a phase detector having a first input receiving an output of a timebase oscillator, and a second input which can be coupled to a frequency reference; a summer having a first input coupled by a switch to the output of the phase detector and having an output coupled to the voltage control input of the timebase oscillator; a digital to analog (D/A) converter having an analog output connected to the second input of the summer; and a digital voltmeter having an input coupled to the output of the phase detector.

With such a system, the output of the digital voltmeter provides a voltage proportional to the frequency error between the timebase and the frequency reference standard. By adjusting the digital input to the D/A converter to generate an analog output voltage which drives the output of the voltmeter to zero volts, the frequency of the timebase is calibrated to match the frequency of the reference.

The system can be configured so that an untrained operator can calibrate the time base. Such a configuration is provided by connecting the output of the digital voltmeter to a display, and providing an operator interface to the input of the D/A converter. The operator observes the display and adjusts the D/A converter input until the voltmeter indicates the phase detector output is nulled to calibrate the timebase. After calibrating the timebase, the operator can open the switch connecting the phase detector to the summer and disconnect the reference oscillator.

The system can also be configured to perform calibration automatically upon insertion of a frequency reference. Such a configuration is provided by connecting a processor to receive the output of the digital voltmeter, and to provide an output to drive the digital input of the D/A converter. The processor is programmed to adjust the input of the D/A converter until the output of the digital voltmeter goes to zero volts to calibrate the timebase. A signal detector is connected to the frequency reference input to provide an indication to the processor when a frequency reference is connected. A further connection from the processor to the switch enables the processor to close the switch upon detection of a frequency reference, and to open the switch after calibration so the frequency reference can be removed.

BRIEF DESCRIPTION OF THE DRAWINGS

Further details of the present invention are explained with the help of the attached drawings in which.

DETAILED DESCRIPTION

Figure 1:
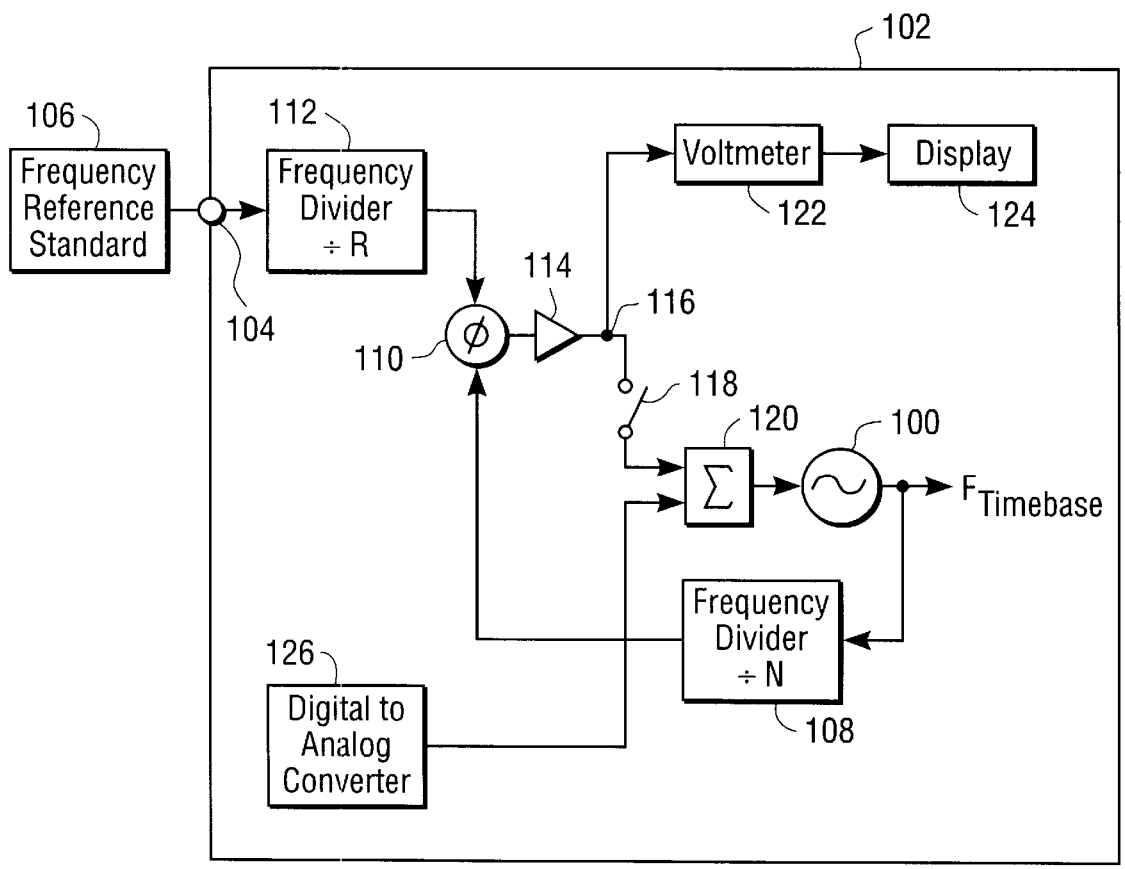
FIG. 1 shows components of a timebase calibration system of the present invention.

FIG. 1 shows components of a timebase calibration system of the present invention. The system includes a timebase voltage controlled oscillator (VCO) 100 which is included in an instrument 102. An example of a instrument containing a timebase oscillator is the Anritsu 68A or 68B series frequency synthesizer available from Anritsu Corporation of Morgan Hill, Calif. The timebase oscillator 100 is also preferably an oven controlled crystal oscillator to minimize frequency shift over time after calibration.

The instrument 102 includes a terminal 104 providing a connection for a frequency reference standard 106. Calibration of the timebase oscillator 100 includes determining a voltage to provide to a voltage control input of the timebase oscillator 100 so that the timebase oscillator frequency is synchronized with the frequency reference standard.

The output of the timebase oscillator 100 is connected through a frequency divider 108 to a first input of a phase detector 110. The frequency reference standard 106 is connected through a frequency divider 112 to a second input of the phase detector 110. The output of the phase detector 110 is provided through an amplifier and filter 114 to a node 116. The node 116 is connected through a switch 118 to a first input of a summer 120. The output of the summer 120 is connected to the voltage control input of the timebase oscillator 100.

The frequency division number N of frequency divider 108 and the frequency division number R of frequency divider 112 are set so that the inputs of the phase detector 110 will be at substantially the same frequency. The output of the phase detector 110 will then provide a voltage at node 116 proportional to any frequency difference between its inputs. With switch 118 closed, and only the signal from node 116 being provided to summer 120, a phase locked loop is formed creating a voltage at node 116 to synchronize the timebase 100 with the frequency reference standard 106.

A voltmeter 122 is further provided in the timebase calibration system of the present invention with an input connected at node 116. The output of the voltmeter 122 provides an indication of the voltage level at node 116 to a display 124.

A second input of the summer 120 is connected to the output of a digital to analog (D/A) converter 126. An operator can interface with the D/A converter and adjust the voltage it provides to summer 120 to drive the voltage at the output of phase detector 110 to zero volts. The timebase oscillator 100 output frequency will then be calibrated to the frequency reference standard 106 and the output from the D/A converter 126 provides the calibration voltage value. Although not shown, a potentiometer may be used in place of the D/A converter 126.

Once calibration is complete, switch 118 can be opened and the frequency reference standard 106 disconnected from terminal 104. The timebase oscillator 100 will remain synchronized with the frequency reference 106 after the switch 118 is opened as long as the D/A converter 126 maintains the calibration voltage.

The accuracy of the calibration will be related to output voltage resolution for the D/A converter 126, the accuracy of the frequency reference standard, and the magnitude of N and R in the frequency dividers 108 and 112. The smaller N and R are, the more accurate the calibration. Also, the greater the number of digital input bits to a D/A converter 126, the better its resolution and the more accurate the calibration will be.

As shown in FIG. 1, the only component needed external to the instrument 102 is the frequency reference standard 106. The voltmeter 122 and display 124, although shown as components internal to instrument 102 can be externally connectable benchtop components with node 116 providing a connection terminal. With the timebase calibration system shown in FIG. 1, an operator with limited training can perform calibration.

Figure 2:
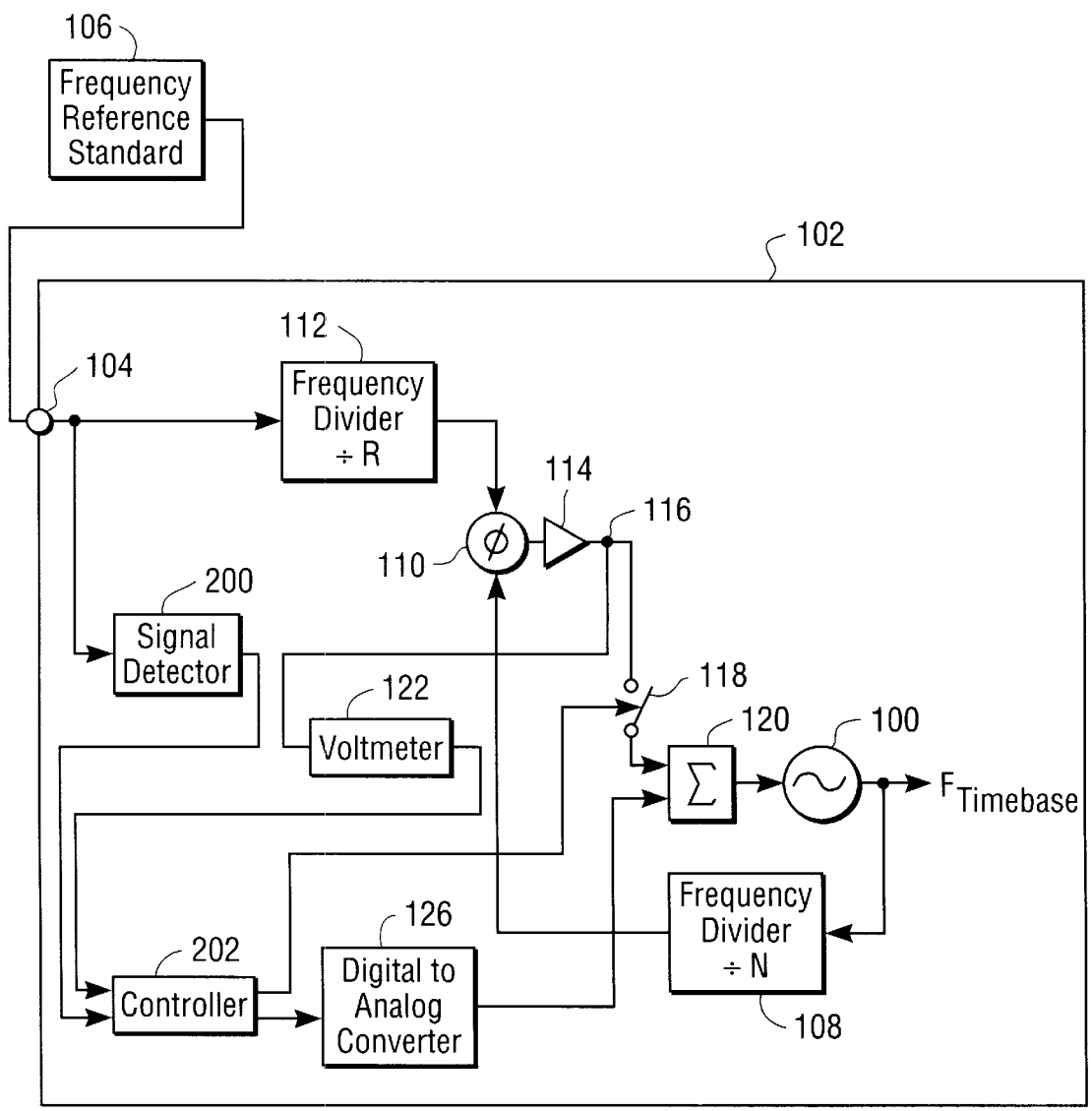
FIG. 2 shows components of a timebase calibration system of the present invention configured to provide automatic calibration.

FIG. 2 shows components for a timebase calibration system configured to provide automatic calibration. In FIG. 2, a signal detector 200 and controller 202 are added to the circuitry of FIG. 1. Components carried over from FIG. 1 to FIG. 2 are similarly labeled.

The signal detector 200 is a device for detecting when a frequency reference standard 106 is plugged into terminal 104. Circuitry for the signal detector 200 can, thus, include a peak detector connected in series with a voltage level indicator, such as an inverter. The output of the signal detector 200 provides a signal to controller 202 indicating whether or not the frequency reference standard 106 is connected to terminal 104.

The voltmeter 122 of FIG. 2 connects the node 116 to a second input of the controller 202. The voltmeter 122 is preferably a digital volt meter to provide the analog voltage output of the phase detector 110 and amplifier and filter 114 as a digital signal to controller 202.

A first output of the controller 202 provides a digital input to the D/A converter 126. A second output of the controller 202 is provided to control opening and closing of switch 118. The controller 202 includes a processor with memory, such as a 8051 microcontroller. The controller 202 is programmed to close the switch 118 when the output of signal detector 200 indicates a frequency reference standard 106 has been connected to terminal 104. The controller 202 then monitors the voltage from the output of the voltmeter 122 and adjusts the digital input to the D/A converter 126 until the output of the voltmeter 122 reads zero volts. The digital value then provided to the D/A converter 126 is stored as a calibration value and the switch 118 is opened by the controller 202. The frequency reference standard 106 can then be disconnected from terminal 104. The controller 202 detects disconnection of the frequency reference standard 106 using signal detector 200 and will initiate another calibration process upon reinsertion of a frequency reference standard 106 to terminal 104.

As an alternative to the signal detector 200, a user interface can be provided to the controller 202 to enable a user to initiate the calibration process. With such an arrangement, the user would connect the frequency reference standard 106 to the terminal 104 and then initiate the calibration. The controller 202 would then close the switch 118 and monitor the voltage from the output of the voltmeter 122 and adjust the input to the D/A converter 126 until the output of the voltmeter 122 is nulled. The controller 200 would then reopen the switch 118.

Although the present invention has been described above with particularity, this was merely to teach one of ordinary skill in the art how to make and use the invention. Many other modifications will fall within the scope of the invention, as that scope is defined by the claims provided below.

What is claimed is:

1. A timebase calibration system comprising:

a timebase oscillator having a voltage control input and an output;

a phase detector having a first input coupled to the output of the timebase oscillator, a second input coupled to a frequency reference connection terminal, and having an output;

a summer having a first input coupled to the output of the phase detector, a second input, and having an output coupled to the voltage control input of the timebase oscillator;

a digital to analog (D/A) converter having an analog output coupled to the second input of the summer, and having a digital input; and a processor having an input coupled to the output of the phase detector and having an output coupled to the input of the D/A converter, the processor for providing a calibration value to the input of the D/A converter so that the output of the phase detector will be substantially zero volts.

2. The timebase calibration system of claim 1 further comprising:

a voltmeter coupling the output of the phase detector to the processor.

3. The timebase calibration system of claim 1 further comprising:

a signal detector having an input coupled to the frequency reference connection terminal and an output connected to the processor, the signal detector providing an indication to the processor when a frequency reference is connected to the frequency reference connection terminal;

a switch coupling the output of the phase detector to the first input of the summer, the switch having a control input provided from the processor, the processor functioning to close the switch after connection of a frequency reference at the frequency reference connection terminal, and to open the switch after providing the calibration value to the input of the D/A converter.

4. A timebase calibration system comprising:

a timebase oscillator having a voltage control input and an output;

a phase detector having a first input coupled to the output of the timebase oscillator, a second input coupled to a frequency reference connection terminal, and having an output;

a summer having a first input coupled to the output of the phase detector, a second input, and having an output coupled to the voltage control input of the timebase oscillator; and a digital to analog (D/A) converter having an analog output coupled to the second input of the summer, and having a digital input provided from a user interface;

a first frequency divider coupling the output of the timebase oscillator to the first input of the phase detector; and a second frequency divider coupling the frequency reference connection terminal to the second input of the phase detector.

5. The timebase calibration system of claim 4 further comprising:

a voltmeter having an input coupled to the output of the phase detector, and having an output; and a display coupled to the output of the voltmeter.

6. A timebase calibration system comprising:

a timebase oscillator having a voltage control input and an output;

a phase detector having a first input coupled to the output of the timebase oscillator, a second input coupled to a frequency reference connection terminal, and having an output;

a summer having a first input coupled to the output of the chase detector, a second input, and having an output coupled to the voltage control input of the timebase oscillator; and a digital to analog (D/A) converter having an analog output coupled to the second input of the summer, and having a digital input;

a switch coupling the output of the phase detector to the first input of the summer.

7. The timebase calibration system of claim 6 further comprising:

a voltmeter having an input coupled to the output of the phase detector, and having an output; and a display coupled to the output of the voltmeter.

8. A method of calibrating a time base comprising the steps of:

monitoring an output voltage of a phase detector having inputs provided by a timebase oscillator and a frequency reference;

varying a voltage provided to a summer, wherein the summer has a first input coupled to receive a DC voltage reference and a second input coupled to the output of the phase detector and an output provided to a voltage control input of the timebase oscillator, the DC voltage provided to the summer being varied until the monitored voltage at the output of the phase detector is substantially zero.

9. The method of claim 8 further comprising the step of:

disconnecting the output of the phase detector from the summer after the voltage at the output of the phase detector is substantially zero.

10. The method of claim 9 further comprising the steps of:

indicating when the frequency reference is connected to an input of the phase detector; and connecting the output of the phase detector to the summer after an indication is provided that the frequency reference is connected to an input of the phase detector.

* * * * *